US009716117B2

(12) United States Patent
Yan et al.

(10) Patent No.: US 9,716,117 B2
(45) Date of Patent: Jul. 25, 2017

(54) METHOD FOR PRODUCING A VIA, A METHOD FOR PRODUCING AN ARRAY SUBSTRATE, AN ARRAY SUBSTRATE, AND A DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Changjiang Yan, Beijing (CN); Kai Lu, Beijing (CN); Jian Guo, Beijing (CN); Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 5 days.

(21) Appl. No.: 14/743,845

(22) Filed: Jun. 18, 2015

(65) Prior Publication Data
US 2016/0079287 A1 Mar. 17, 2016

(30) Foreign Application Priority Data
Sep. 12, 2014 (CN) .......................... 2014 1 0465232

(51) Int. Cl.
H01L 21/84 (2006.01)
H01L 27/12 (2006.01)
(Continued)

(52) U.S. Cl.
CPC .... H01L 27/1259 (2013.01); H01L 21/31116 (2013.01); H01L 21/76804 (2013.01); H01L 29/66765 (2013.01)

(58) Field of Classification Search
CPC ........... H01L 27/1259; H01L 21/31116; H01L 21/76805; H01L 29/66765
See application file for complete search history.

(56) References Cited

U.S. PATENT DOCUMENTS

2003/0045066 A1\* 3/2003 Igarashi .............. H01L 29/0804
438/350
2005/0018114 A1 1/2005 Park et al.
(Continued)

FOREIGN PATENT DOCUMENTS

CN 1573480 A 2/2005
CN 103050438 A 4/2013
(Continued)

OTHER PUBLICATIONS

Office Action in Chinese Application No. 201410465232.4 dated Aug. 3, 2016, with English translation. 13 pages.
(Continued)

Primary Examiner — Bradley K Smith
(74) Attorney, Agent, or Firm — Blakely Sokoloff Taylor & Zafman LLP

(57) ABSTRACT

The invention relates to the field of display technologies, and discloses a method for producing a via, a method for producing an array substrate, an array substrate and a display device to prevent a chamfer from being formed in producing the via, to promote the product quality and improve the display effect of the display device. The method for producing a via comprises: employing a first etching process to partially etch a top film layer in an area that needs to form a via above an electrode, wherein the vertical etching amount achieved by employing the first etching process is less than the thickness of the top film layer; and employing a second etching process for which the vertical etching rate is larger than the lateral etching rate to etch the remaining part in the area that needs to form a via, until the electrode is exposed.

11 Claims, 9 Drawing Sheets

(51) Int. Cl.
*H01L 21/311* (2006.01)
*H01L 29/66* (2006.01)
*H01L 21/768* (2006.01)

(56) References Cited

U.S. PATENT DOCUMENTS

| | | | | |
|---|---|---|---|---|
| 2005/0139938 A1* | 6/2005 | Kim | ................ | H01L 21/28052 257/412 |
| 2005/0215051 A1* | 9/2005 | Yang | ................ | H01L 21/76813 438/624 |
| 2007/0197041 A1* | 8/2007 | Nakaya | ............... | H01J 37/3266 438/717 |
| 2009/0115947 A1 | 5/2009 | Huang et al. | | |

FOREIGN PATENT DOCUMENTS

| | | |
|---|---|---|
| CN | 103383945 A | 11/2013 |
| CN | 103985708 A | 8/2014 |
| CN | 104035231 A | 9/2014 |
| KR | 101005552 B1 | 12/2010 |

OTHER PUBLICATIONS

Office Action in Chinese Application No. 201410465232.4 dated Jan. 3, 2017, with English translation. 9 pages.
Decision on Rejection in Chinese Application No. 201410465232.4 dated Apr. 1, 2017, with English translation. 10 pages.

* cited by examiner

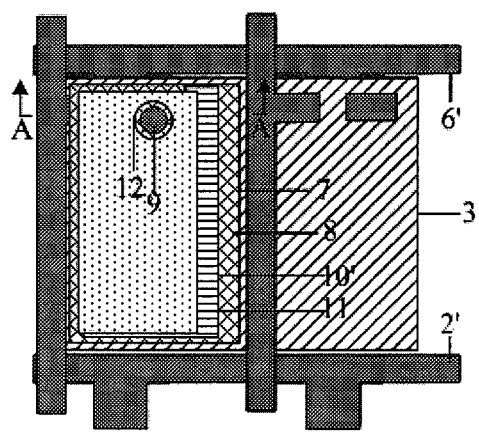
Fig. 1   - - Prior Art - -
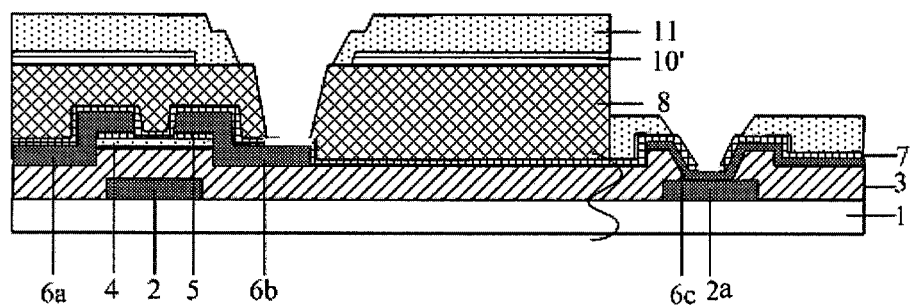
Fig. 2   - - Prior Art - -

METHOD FOR PRODUCING A VIA, A METHOD FOR PRODUCING AN ARRAY SUBSTRATE, AN ARRAY SUBSTRATE, AND A DISPLAY DEVICE

RELATED APPLICATIONS

The present application claims the benefit of Chinese Patent Application No. 201410465232.4, filed Sep. 12, 2014, the entire disclosures of which are incorporated herein by reference.

FIELD OF THE INVENTION

The invention relates to the field of display technologies, and in particular, to a method for producing a via, a method for producing an array substrate, an array substrate and a display device.

BACKGROUND OF THE INVENTION

With reference to FIG. 1 and FIG. 2, the basic structure of an array substrate of a current display device generally comprises: a substrate base 1, a gate 2 and a gate line 2', a gate insulating layer 3, an active layer 4, an ohmic material layer 5, a source 6a, a drain 6b and a data line 6', a protective layer 7, a first passivation layer 8, a common electrode 10', a second passivation layer 11, and a pixel electrode (not shown in the figures), etc. In general, it is needed to undergo eight times of patterning process so as to be able to complete the production of an array substrate, including forming a via for conduction disposed between electrodes at different layers by etching.

However, since the materials of the different layers are different, in the procedure of forming a via penetrating at least two layers by etching, it very easily results in poor chamfering of the via in one and the same etching process due to lateral etching rates being different (as shown in FIG. 2), thereby causing the electrical performance to degrade. Especially, a via for conductively lapping the pixel electrode and the drain (or the source) needs to penetrate the protective layer, the first passivation layer and the second passivation layer. Yet, the material of the protective layer is generally silicon nitride, the material of the first passivation layer is generally a photosensitive resin, etc., and the material of the second passivation layer is generally low temperature silicon nitride, etc. The lateral etching rates of the three materials in one and the same etching process are distinct, resulting in poor chamfering of the via, such that the contact of the pixel electrode and the drain (or the source) is poor, which brings about the problem of abnormal pixel display such as constant bright spots, dark spots, interlaced alternating lightness and darkness, etc. of a display screen.

SUMMARY OF THE INVENTION

An object of the embodiment of the present invention is to provide a method for producing a via, a method for producing an array substrate, an array substrate and a display device to prevent a chamfer from being formed in producing a via, so as to promote the product quality and improve the display effect of the display device.

An embodiment of the invention provides a method for producing a via comprising:

employing a first etching process to partially etch a top film layer in an area that needs to form a via above an electrode, wherein the vertical etching amount by employing the first etching process is less than the thickness of the top film layer; and employing a second etching process for which the vertical etching rate is larger than the lateral etching rate to etch the remaining part in the area that needs to form a via, until the electrode is exposed.

By employing the method for producing a via comprising the two steps provided by the technical solution to produce a via, a chamfer can be effectively prevented from being formed at the via, thereby causing the contact between electrodes is relatively reliable, effectively improving the electrical performance and promoting the product quality; and since in the procedure of producing the via, the lateral etching rate is relatively evident only when employing the first etching process, whereas the lateral etching rate is relatively small and the vertical etching plays a dominant role when employing the second etching process, the via after the completion of production is relatively small, and especially when the method for producing a via provided by the embodiment is applied in producing an array substrate, more spaces can be saved, thereby enhancing the aperture ratio, increasing the pixel density, and greatly improving the display effect of a product with the array substrate.

In an embodiment, the vertical etching amount achieved by employing the first etching process may be 70% of the thickness of the top film layer.

Further, the step of employing a second etching process for which the vertical etching rate is larger than the lateral etching rate to etch the remaining part in the area that needs to form a via, until the electrode is exposed, may comprise:

employing a second etching process for which the ratio of the vertical etching rate to the lateral etching rate is no less than 3 to etch the remaining part in the area that needs to form a via, until the electrode is exposed.

An embodiment of the invention further provides a method for producing an array substrate comprising:

forming in sequence from bottom to top a metal layer comprising a pattern of a gate line and a gate, a gate insulating layer and an active layer on a substrate base;

forming a metal layer comprising a pattern of a source and a drain;

forming a protective layer covering the substrate base and a first passivation layer comprising a first via located above the drain and exposing the protective layer;

forming a metal layer comprising a pattern of a first electrode;

forming a second passivation layer; wherein the method for producing an array substrate further comprises the following steps of:

employing the method for producing a via as described in any one of the above technical solutions to produce a second via located above the drain in the second passivation layer; and forming a metal layer comprising a pattern of a second electrode, realizing an electrical connection between corresponding electrode patterns.

Since the method for producing an array substrate employs any one of the above methods for producing a via, the method for producing an array substrate provided by this technical solution also has the above mentioned beneficial effects.

An embodiment of the invention further provides an array substrate produced by employing the above method for producing an array substrate, the electrical performance of the array substrate is relatively good, its product quality is relatively high, it has a relatively high pixel density, and when applied in a display device, it causes the display device to have a relatively high aperture ratio, greatly improving the display effect.

An embodiment of the invention further provides a display device comprising any one of the above array substrates. The aperture ratio of the display device is relatively high, thereby increasing the utilization rate of a backlight, increasing the display brightness of the product, lowing the power consumption, and these beneficial effects are particularly evident especially for a display device with a high resolution; and since the electrical performance of the array substrate is relatively good, the display effect of the display device can be improved effectively.

BRIEF DESCRIPTION OF THE DRAWINGS

FIG. 1 is a structural schematic plan view of an existing array substrate after the completion of producing the second passivation layer and its via;

FIG. 2 is a schematic diagram comprising a cross-section along A-A in the array substrate shown in FIG. 1;

Figure 3:
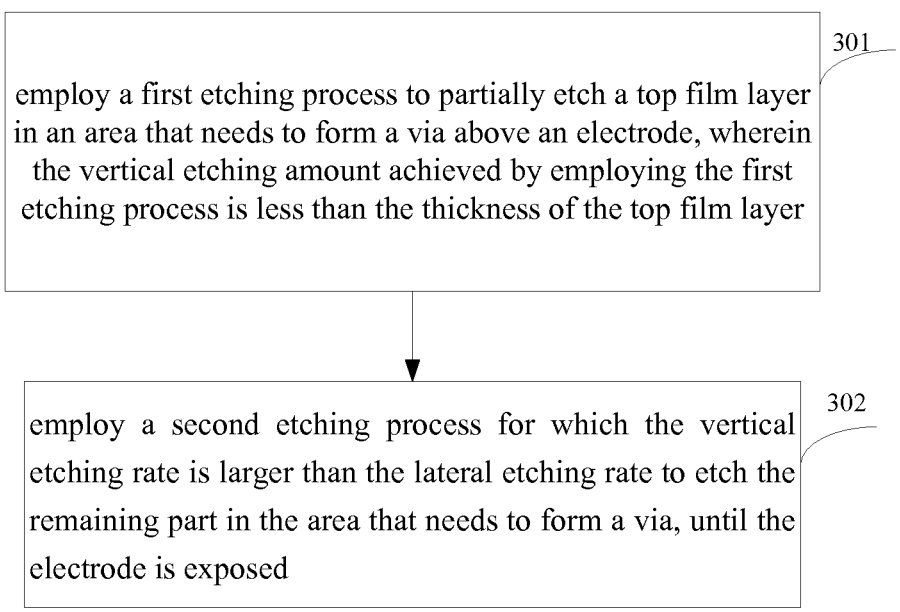
FIG. 3 is a flow diagram of an example of a method for producing a via provided by an embodiment of the invention.

It needs to be noted that in the sectional structural diagrams of FIG. 2 and FIGS. 5-17, sectional structural diagrams of the periphery structure (row pixel driving unit) of an effective display area A-A of the array substrate are further shown schematically, as shown in the portion on the right side of the curve in an individual figure, and since it may be produced in the same process as the effective display area of the array substrate, it is shown together herewith.

REFERENCE SIGNS 1 substrate base
2 gate
2' gate line (display area)
2a gate line (non-display area)
3 gate insulating layer
4 ohmic material layer
5 active layer
6a source
6b drain
6c metal lead
6' data line
7 protective layer
8 first passivation layer
9 first via
10 first electrode
11 second passivation layer
12 second via
13 fourth via
14 photoresist
15 second electrode
10' common electrode

DETAILED DESCRIPTION OF THE INVENTION

To prevent a chamfer from being formed in producing a via to promote the product quality and improve the display effect of a display device, embodiments of the invention provide a method for producing a via, a method for producing an array substrate, an array substrate and a display device. In these technical solutions, a via is formed by etching by the two steps of employing a first etching process to partially etch a top film layer in an area that needs to form a via above an electrode, wherein the vertical etching amount achieved by employing the first etching process is less than the thickness of the top film layer; and employing a second etching process for which the vertical etching rate is larger than the lateral etching rate to etch the remaining part in the area that needs to form a via, until the electrode is exposed, which can effectively prevent a chamfer from being formed in producing a via, to promote the product quality and improve the display effect of the display device. To make the objects, technical solutions and advantages of the invention more clear, the invention will be further described in detail taking specific embodiments as examples in the following.

Figure 13:
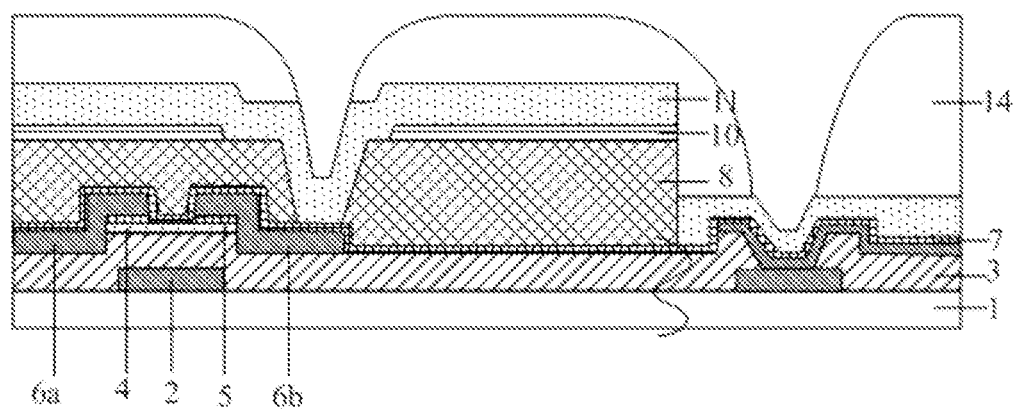
Figure 14:
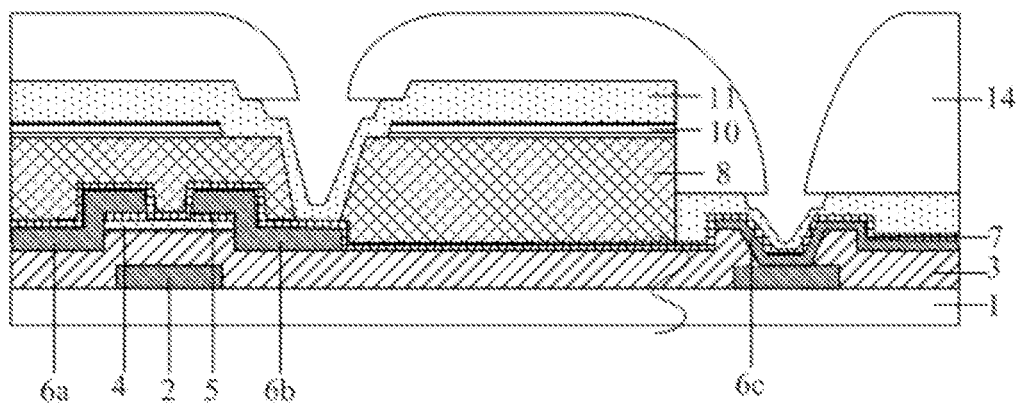
Figure 15:
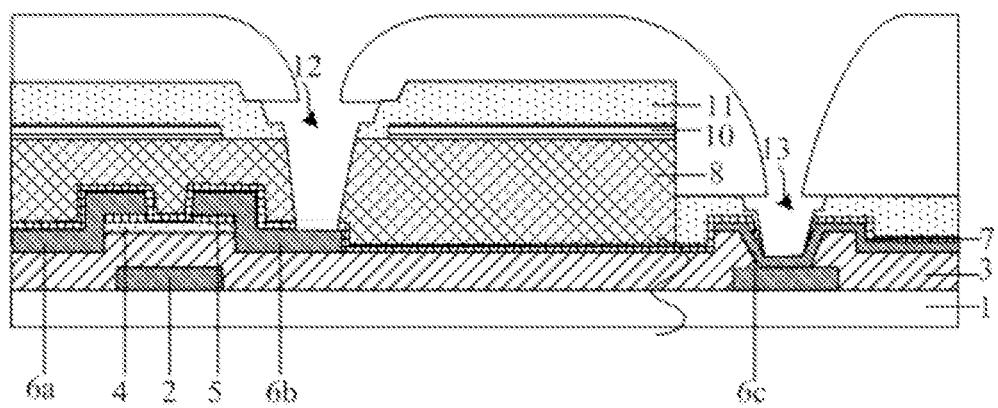

As shown in FIG. 3, and with reference to FIGS. 13-15, an embodiment of the invention provides a method for producing a via comprising the following steps:

In step 301, a first etching process is employed to partially etch a top film layer in an area that needs to form a via above an electrode, wherein the vertical etching amount achieved by employing the first etching process is less than the thickness of the top film layer.

In step 301, the vertical etching amount achieved by employing the first etching process is not limited, and is in particular determined according to the requirements for the first etching process and the etching uniformity (the etching amount is identical when employing the same etching process to etch multiple vias once), for example, the vertical etching amount achieved by employing the first etching process may be 70% of the thickness of the top film layer.

The specific etching conditions of the first etching process are not limited, for example, a chemical etching based physical-chemical dry etching or a chemical dry etching may be employed.

In step 302, a second etching process for which the vertical etching rate is larger than the lateral etching rate is employed to etch the remaining part in the area that needs to form a via, until the electrode is exposed.

With reference to FIG. 13, in the method for producing a via provided by the embodiment, before step 301, the method may further comprise producing a mask plate covering a second passivation layer, for example, coating a photoresist, and the coated photoresist amounts to a mask plate. In step 301, due to a significant lateral etching rate, there is a clear amount of indentation at an opening of the top film layer forming a via which forms a slope angle; and step 301 only partially etches the top film layer in an area that needs to form a via, the vertical etching amount being less than the thickness of the top film layer (that is, the vertical etching amount can not exceed the thickness of the top film layer), and does not etch a film layer below the top film layer, thereby effectively avoiding the formation of a chamfer at the via due to the materials of the film layers being different.

In step 302, the mask plate may effectively protect the slope angle below the mask plate, and the vertical etching rate is larger than the lateral etching rate, that is, in the second etching process, there is a large selection ratio between the vertical etching rate and the lateral etching rate, and since the lateral etching rate is relatively small, in the procedure of etching the remaining part in the area that needs to form a via, until the electrode is exposed, a chamfer can be effectively prevented from being formed at the via due to the materials of the film layers being different.

From the above, by employing the method for producing a via comprising the two steps provided by the embodiment to produce a via, a chamfer can be effectively prevented from being formed at the via, thereby causing the contact between electrodes is relatively reliable, effectively improving the electrical performance and promoting the product quality; and since in the procedure of producing a via, the lateral etching rate is relatively evident only when employing the first etching process, whereas the lateral etching rate is relatively small and the vertical etching plays a dominant role when employing the second etching process, the via after the completion of production is relatively small, and especially when the method for producing a via provided by the embodiment is applied in producing an array substrate, more spaces can be saved, thereby enhancing the aperture ratio, increasing the pixel density, and greatly improving the display effect of a product with the array substrate.

In an embodiment, step 302 may employ a second etching process for which the ratio of the vertical etching rate to the lateral etching rate is no less than 3 to etch the remaining part in the area that needs to form a via, until the electrode is exposed. With the increase of the ratio of the vertical etching rate to the lateral etching rate, the dominant role of the vertical etching rate is more evident, and the lateral etching rate is much less as compared to the vertical etching rate, thereby further effectively preventing the formation of a chamfer at the via due to the materials of the film layers being different. For example, the second etching process may employ a physical etching based physical-chemical dry etching.

Figure 4:
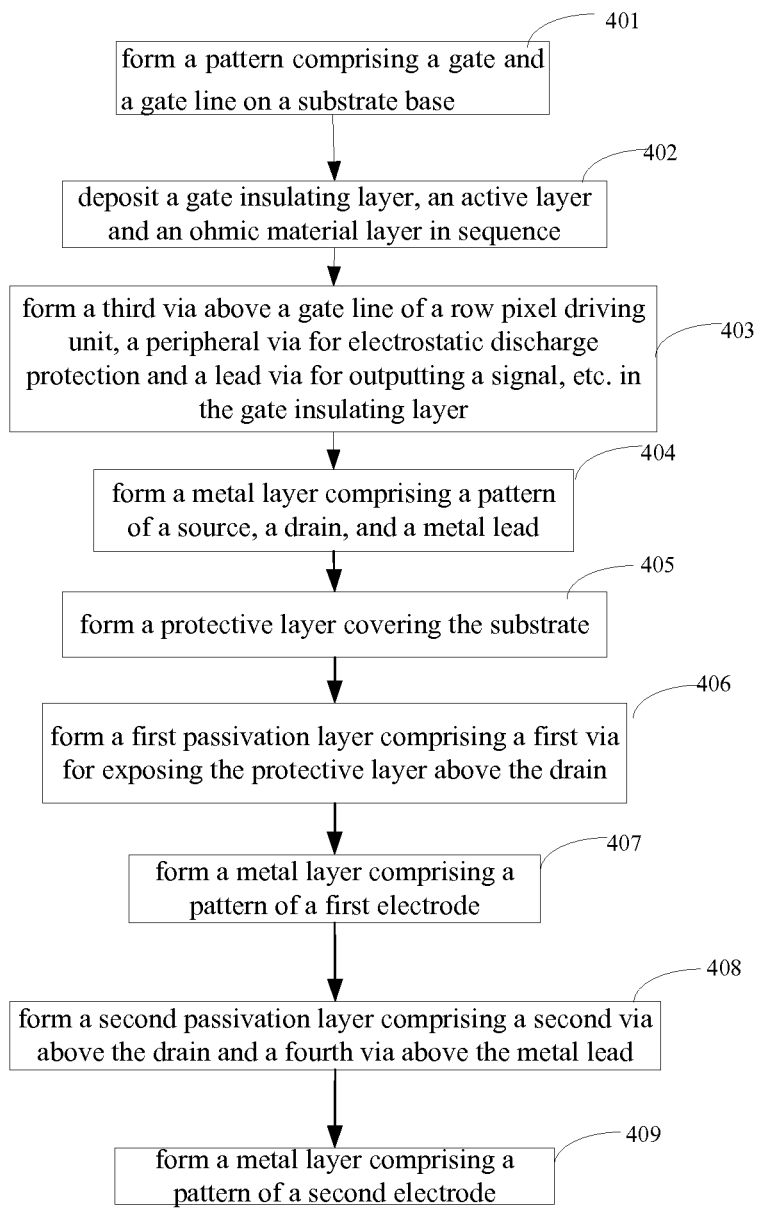
FIG. 4 is a flow diagram of an example of a method for producing an array substrate provided by an embodiment of the invention.

An embodiment of the invention further provides a method for producing an array substrate. The array substrate may comprise a thin film transistor unit (pixel unit) and a row pixel driving unit. The method for producing an array substrate provided by an embodiment of the invention will be described taking that the array substrate comprises a thin film transistor unit (pixel unit) and a row pixel driving unit as an example. An example of the production method as shown in FIG. 4 comprises the following steps.

Figure 5:
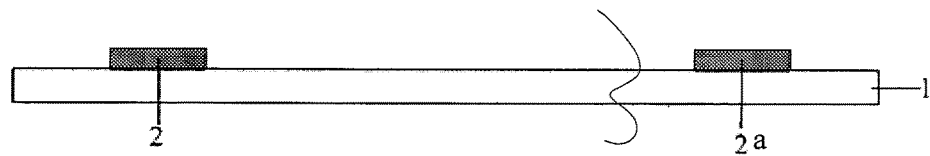
FIGS. 5~17 are structural diagrams of an array substrate provided by embodiments of the invention after the completion of individual production steps.

In step 401, a pattern comprising a gate 2 and a gate line 2a is formed on a substrate base 1, and reference is made to FIG. 5, which is a schematic diagram of a cross-sectional structure of the array substrate after the gate and the gate line are formed;

wherein the formed gate may comprise a gate of a pixel unit in a display area and a gate of a row pixel driving unit in a non-display area, and step 401 may deposit a gate metal thin film (e.g., aluminum neodymium alloy, or aluminum molybdenum alloy) on the substrate base 1, and forms the pattern comprising the gate 2 and the gate line 2a by a one-time patterning process. The one-time patterning process may comprise such a working procedure as substrate cleaning, film formation, photoresist coating, exposure, development, etching, photoresist stripping, etc.; for a metal layer, it may be possible to employ a physical vapor deposition method (e.g., magnetron sputtering method) to form a film, and form a pattern by wet etching, whereas for a non-metal layer, it may be possible to employ a chemical vapor deposition method to form a film and form a pattern by dry etching, and the principles of the subsequent steps are the same and will not be repeated. Note that the gate line 2a as shown in FIG. 5 and the following individual figures represents a part of a gate line in the non-display area around the effective display area of the array substrate and electrically connected with a gate of the pixel unit in the display area.

Figure 6:
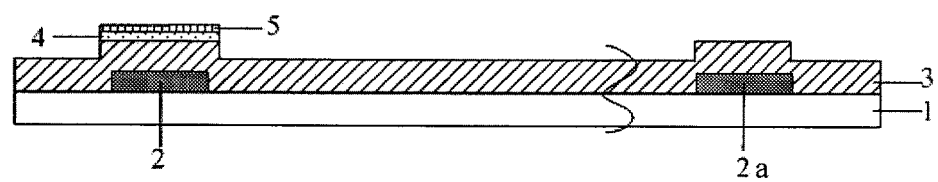

In step 402, a gate insulating layer 3, an active layer 4 and an ohmic material layer 5 are deposited in sequence on the substrate after step 401, and reference is made to FIG. 6, which is a schematic diagram of a cross-sectional structure of the array substrate after the active layer is formed.

The material of the gate insulating layer may be, but not limited to, silicon nitride, the material of the ohmic material layer may be, but not limited to, doped silicon (n+Si), and the material of the active layer may be, but not limited to, amorphous silicon (a-Si).

Figure 7:
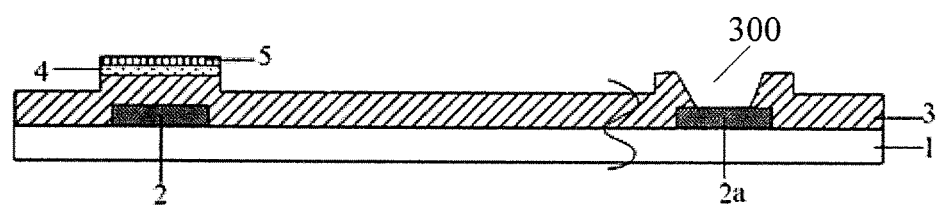

In step 403, a third via above the gate line of the row pixel driving unit, a peripheral via for electrostatic discharge protection and a lead via for outputting a signal, etc. are formed in the gate insulating layer 3 by a one-time patterning process, and reference is made to FIG. 7, which is a schematic diagram of a cross-sectional structure of the array substrate after the third via above the gate line of the row pixel driving unit is formed in the gate insulating layer.

Figure 8:
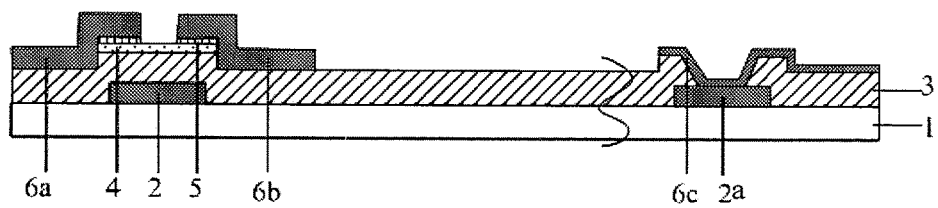

In step 404, a metal layer comprising a pattern of a source 6a, a drain 6b, a metal lead 6c and a data line 6' is formed, wherein the metal lead 6c is located above the gate line of the row pixel driving unit, and reference is made to FIG. 8, which is a schematic diagram of a cross-sectional structure of the array substrate after a pattern comprising the source, the drain and the metal lead is formed.

Step 404 may deposit a source drain metal film on the substrate after step 403, form a pattern of the source 6a and the drain 6b above the gate by wet etching, and remove the active layer between the source 6a and the drain 6b by dry etching.

Figure 9A:
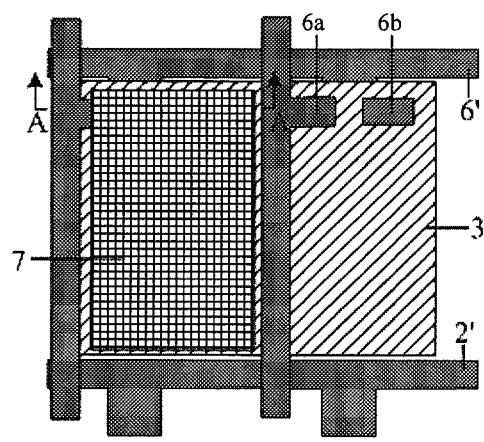
Figure 9B:
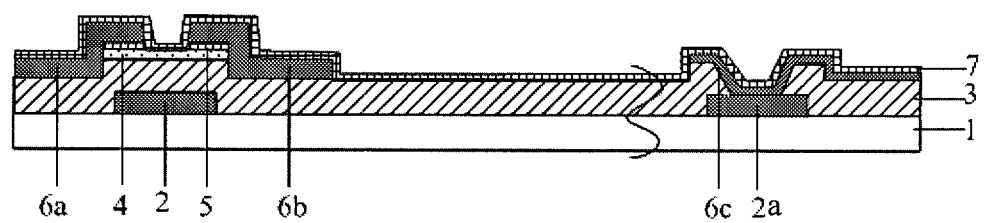

In step 405, a protective layer 7 covering the substrate is formed, and the material of the protective layer 7 is not limited and may be silicon nitride. Reference is made to FIG. 9a, which is a schematic structural plan view of the array substrate after the protective layer is formed, and FIG. 9b is a schematic diagram comprising a cross-section along A-A in the array substrate shown in FIG. 9a.

Figure 10A:
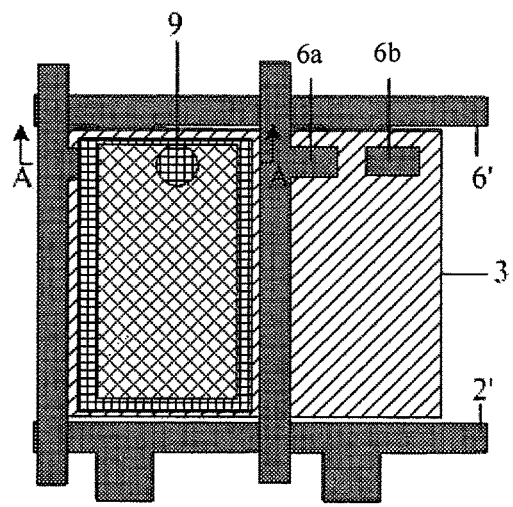
Figure 10B:
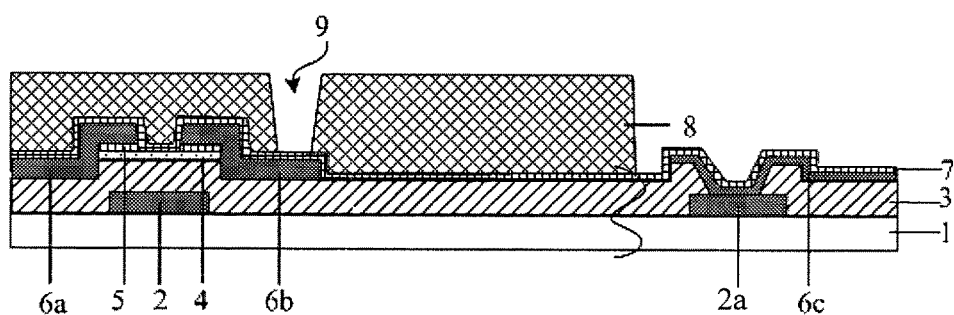

In step 406, a first passivation layer 8 comprising a first via 9 for exposing the protective layer 7 above the drain is formed, reference is made to FIG. 10a, which is a schematic structural plan view of the array substrate after the first passivation layer is formed, and FIG. 10b is a schematic diagram comprising a cross-section along A-A in the array substrate shown in FIG. 10a.

The material of the first passivation layer is not limited, for example, may be resin material. When the material of the first passivation layer is photosensitive resin material, step 406 may comprise coating the photosensitive resin material, exposure, development, curing the resin film, and forming a via of the passivation layer for exposing the protective layer above the drain by etching.

Figure 11A:
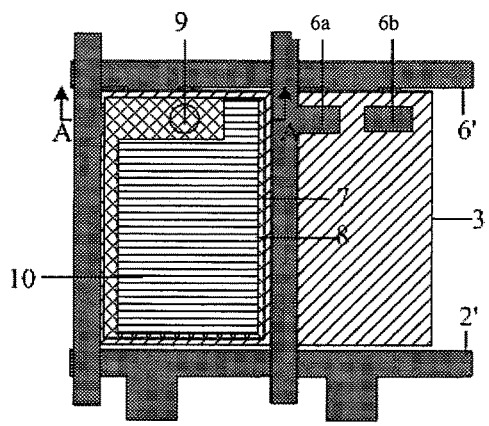
Figure 11B:
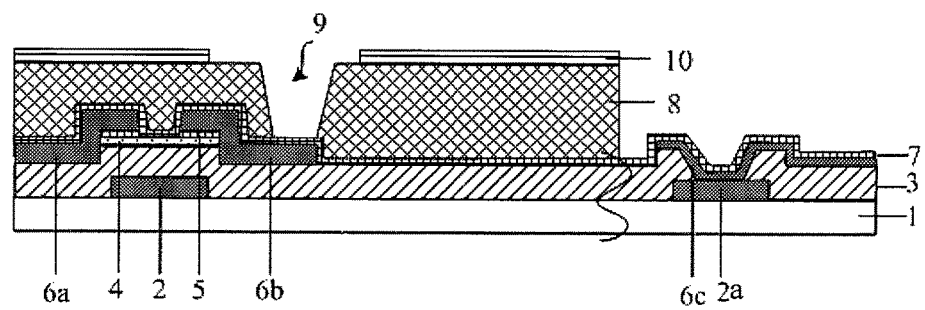

In step 407, a metal layer comprising a pattern of a first electrode 10 is formed, reference is made to FIG. 11a, which is a schematic structural plan view of the array substrate after the first electrode is formed, and FIG. 11b is a schematic diagram comprising a cross-section along A-A in the array substrate shown in FIG. 11a.

Figure 16:
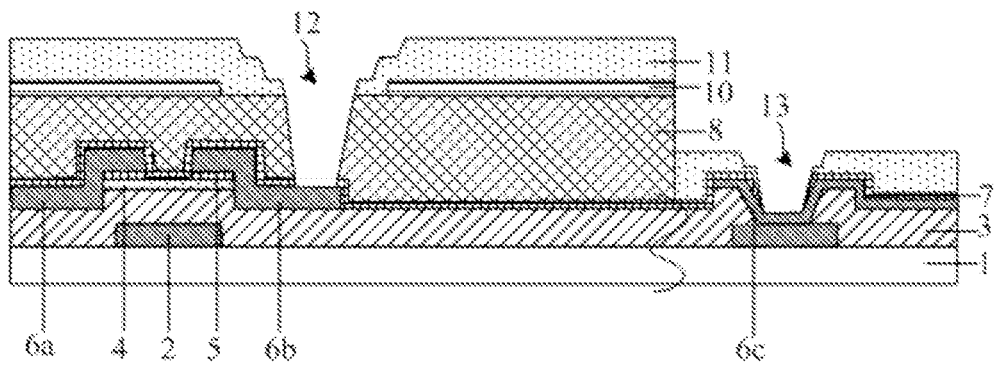

In step 408, a second passivation layer 11 comprising a second via 12 above the drain and a fourth via 13 above the metal lead is formed, and reference is made to FIG. 16, which is a schematic diagram of a cross-sectional structure of the array substrate after the second passivation layer comprising the second via above the drain and the fourth via above the metal lead is formed;

wherein the material of the second passivation layer 11 is not limited, and may be low temperature silicon nitride material.

Figure 12:
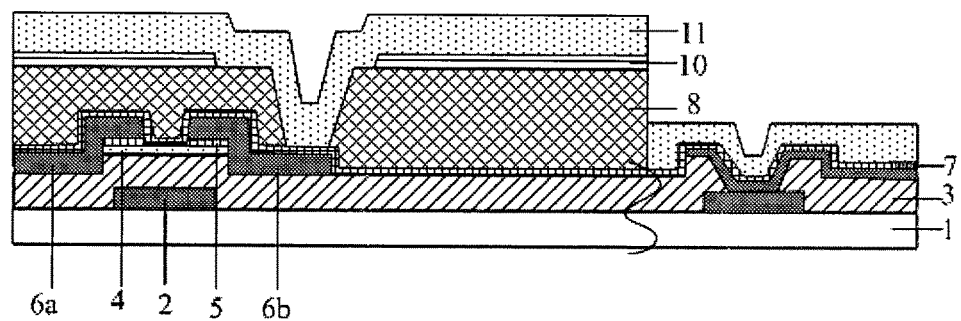

Step 408 may comprise the following steps: with reference to FIGS. 12-14, depositing material of the second passivation layer 11, coating a photoresist 14 to produce a mask plate, and employing a first etching process to partially etch the second passivation layer 11 in an area that needs to form a via above the drain and the metal lead, wherein the vertical etching amount achieved by employing the first etching process is less than the thickness of the second passivation layer, and wherein FIG. 12 is a schematic diagram of a cross-sectional structure of the array substrate after the material of the second passivation layer is deposited, FIG. 13 is a schematic diagram of a cross-sectional structure of the array substrate after the photoresist 14 is coated to form the mask plate, and FIG. 14 is a schematic diagram of a cross-sectional structure of the array substrate after the first etching process is employed to etch the second passivation layer.

With reference to FIG. 15, a second etching process for which the vertical etching rate is larger than the lateral etching rate is employed to etch the remaining part in the area that needs to form a via, until the drain 6b and the metal lead 6c are exposed, thereby forming the second via 12 and the fourth via 13, and FIG. 15 is a schematic diagram of a cross-sectional structure of the array substrate after the second etching process is employed to etch and form the second via and the fourth via.

Figure 17:
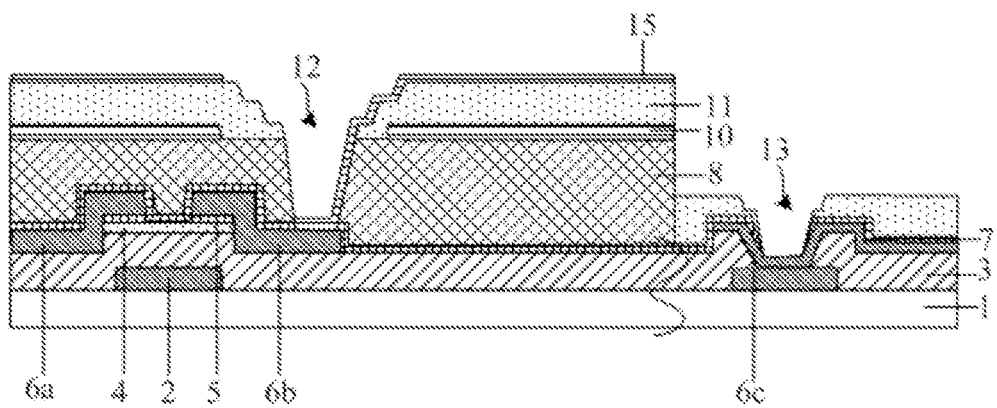

In step 409, a metal layer comprising a pattern of a second electrode 15 is formed, and an electrical connection between corresponding electrode patterns is realized. Reference is made to FIG. 17, which is a schematic diagram of a cross-sectional structure of the array substrate after the pattern comprising the second electrode is formed.

It needs to be noted that the materials of the first electrode and the second electrode may be a transparent conductive material, for example, indium tin oxide, the first electrode may be a common electrode and the second electrode may be a pixel electrode.

So far, the production of the array substrate is completed. From the production procedure above, it can be seen that, since a method for producing a via with the two steps comprised by step 408 is employed to produce a via, a chamfer can be effectively prevented from being formed at the via, thereby causing the contact between electrodes is relatively reliable, effectively improving the electrical performance and promoting the product quality; and since in the procedure of producing the via, the lateral etching rate is relatively evident only when employing the first etching process, whereas the lateral etching rate is relatively small and the vertical etching plays a dominant role when employing the second etching process, the via after the completion of production is relatively small, and more space can be saved, thereby enhancing the aperture ratio, increasing the pixel density, and greatly improving the display effect of a product with the array substrate.

From the production procedure above, it can be seen that the second via may be produced in an area above the drain. In the prior art, the second via is typically produced by employing a one-time dry etching process. To effectively lower the risk of affecting the reliability of lapping the second electrode and the drain due to poor chamfering when producing the second via above the drain, it is generally needed to cause the second via and the first via to overlap in production, that is, after the production of the second via is completed, it can be assured that the material of the top film layer on one side of the second via is not etched, i.e., a chamfer is not generated on the side. However, the size of the area where the second via and the first via overlap is very easily affected by the precision of the process equipment, thereby a situation occurs very easily in which the second via and the first via do not overlap or coincide completely, and the risk of the occurrence of a chamfer is very high. As compared to the prior art, the method for producing an array substrate provided by the embodiment can effectively prevent a chamfer from occurring when producing the second via, and therefore the requirements for the positions where the second via and the first via are produced are lowered, thereby reducing the requirement for the precision of the process equipment and thereby reducing the production cost; moreover, it is allowed that the second via and the first via may coincide completely, thereby further saving spaces, enhancing the aperture ratio, increasing the pixel density, and greatly improving the display effect of a product with the array substrate.

In an embodiment of the invention, the material of the protective layer 7 may be silicon nitride, the material of the first passivation layer 8 may be photosensitive resin, and the material of the second passivation layer 11 may be low temperature silicon nitride. In this case, step 408 may comprise the following steps:

In a first step, as shown in FIG. 12, the low temperature silicon nitride material is deposited. The thickness of the low temperature silicon nitride material may be set according to the particular design requirements of the array substrate, for example, the thickness of the low temperature silicon nitride material may be set to be 2500±320 Å.

In a second step, as shown in FIG. 13, a photoresist 14 with the thickness of 1300-1500 Å is coated to produce a mask plate.

In a third step, as shown in FIG. 14, an etching condition of a mixed gas of $SF_6$, $O_2$ and He and a plasma acceleration power of 2500 W to 3500 W is employed to perform a dry etching for the second passivation layer 11 above the drain 6b and the metal lead 6c, and the vertical etching amount achieved by employing the first etching process may be 1500-2000 Å, that is, a part of the low temperature silicon nitride material is etched away.

Under the etching condition in the third step, $SF_6$ and $O_2$ react chemically with the low temperature silicon nitride, namely, a chemical etching occurs, wherein $O_2$ is a catalyst, and He reacts chemically with the low temperature silicon nitride under the acceleration and guidance of the plasma acceleration power of 2500 W to 3500 W, namely, a physical etching occurs, that is, a vertical etching process with a strong selectivity happens. Under such etching condition, the lateral etching rate is evident, there is a significant amount of indentation at an opening of the second passivation layer to form a slope angle, and at the same time, the third step just partially etches the second passivation layer, such that the first passivation layer 8 and the protective layer 7 below the second passivation layer 11 are not affected by the etching condition and in a protected state, thereby effectively avoiding the generation of a chamfer.

Of course, the third step may also employ a chemical dry etching condition, which will not be defined particularly.

In a fourth step, as shown in FIG. 15, an etching condition of a mixed gas of $SF_6$ and He and a plasma acceleration power of 6000 W to 7500 W is employed to perform a dry etching for the remaining part in the area that needs to form a via, until the drain 6b and the metal lead 6c are exposed.

Before etching in the fourth step, it can be seen from the sectional view shown in the figure that at this time, the thickness of the second passivation layer at the second via and the fourth via may be 500-1000 Å, on both sides is the photosensitive resin material, at the bottom is the silicon nitride protective layer, of which the thickness may be 500-1000 Å. The lateral etching rate for the low temperature silicon nitride under such etching condition is larger than the lateral etching rate for the resin material, and larger than the lateral etching rate for a normal temperature silicon nitride material. However, since the chemical etching is slow in an oxygen-free environment, and at this time the physical etching plays a dominant role in the dry etching with a high plasma acceleration power, the ratio of the vertical etching rate to the lateral etching rate is relatively large, that is, the selection ratio is relatively high, namely, the vertical etching rate is larger than the lateral etching rate. In the fourth step, a vertical etching with a strong selectivity is mainly performed for the remaining part in the area that needs to form a via, and therefore the generation of a chamfer due to the materials of different film layers being different may be avoided.

In a fifth step, as shown in FIG. 16, the photoresist 14 is stripped.

It can be seen from the third step and the fourth step that the etching condition of the third step causes the lateral etching rate to be relatively large and the slope angle to be formed, and when employing the etching condition of the fourth step for etching, the photoresist mask plate can protect the slope angle formed in the third step, and the etching condition of the fourth step is a dry etching in which the physical etching with a strong selectivity is dominant, so the generation of a chamfer due to the materials of different film layers being different can be avoided in the etching procedure, such that there is no via in the second via and the fourth via, the lapping of the second electrode and the drain is reliable, effectively improving the electrical performance and in turn enhancing the product quality.

It needs to be noted that the first via, the second via, the third via and the fourth via in individual embodiments of the invention are just used for distinguishing vias on different film layers, but not for differentiating the number of vias on the film layers.

An embodiment of the invention further provides an array substrate, which is produced by employing the method for producing an array substrate provided by any one of the above embodiments. Since employing the above described method for producing an array substrate can effectively decrease a via penetrating at least two film layers and effectively prevent a chamfer from being generated when producing the via, for the array substrate provided by the embodiment, its electrical performance is good, its product quality is high, it has a high pixel density, and causes a display device to have a higher aperture ratio when applied in the display device, greatly improving the display effect.

An embodiment of the invention further provides a display device comprising an array substrate as provided by the foregoing embodiment. Since the via is small, and the occupied space is small, the aperture ratio of the display device is higher, thereby increasing the utilization rate of a backlight, increasing the display brightness of the product, lowing the power consumption, and these beneficial effects are particularly evident especially for a display device with a high resolution; and since the electrical performance of the array substrate is relatively good, the display effect of the display device can be improved effectively Apparently, various modifications and variations may be made to the embodiments of the invention by the skilled in the art without departing from the spirit and scope of the invention. As such, provided that these modifications and variations of the embodiments of the invention pertain to the scope of the claims and their equivalents, the invention is also intended to include such modifications and variations.

The invention claimed is:

1. A method for producing an array substrate comprising:
    forming in sequence from bottom to top a metal layer comprising a pattern of a gate line and a gate, a gate insulating layer and an active layer on a substrate base;
    forming a metal layer comprising a pattern of a source and a drain;
    forming a protective layer covering the substrate and a first passivation layer comprising a first via located above the drain and exposing the protective layer;
    forming a first metal layer comprising a pattern of a first electrode;
    forming a second passivation layer; wherein the method for producing an array substrate further comprises the following steps of:
    producing a second via located above the drain in the second passivation layer; and
    forming a second metal layer comprising a pattern of a second electrode to realize electrical connection between corresponding electrode patterns,
    wherein producing the second via comprises the following steps of:
    employing a first etching process to partially etch the second passivation layer in an area that needs to form a via above the drain, wherein the vertical etching amount achieved by employing the first etching process is less than the thickness of the second passivation layer; and
    employing a second etching process for which the vertical etching rate is larger than the lateral etching rate to etch the remaining part in the area that needs to form a via, until the drain is exposed,
    wherein a material of the second passivation layer is silicon nitride, and wherein each of the first etching process and the second etching process is a fluorine based etching process.

2. The method for producing an array substrate as claimed in claim 1, wherein before the step of forming a metal layer comprising a pattern of a source and a drain, the method further comprises:
    forming in the gate insulating layer a third via above a gate line of a row pixel driving unit.

3. The method for producing an array substrate as claimed in claim 2, further comprising: forming a metal lead above the gate line of the row pixel driving unit at the same time of forming the metal layer comprising a pattern of a source and a drain; and
    forming a fourth via above the metal lead at the same time of producing the second via located above the drain.

4. The method for producing an array substrate as claimed in claim 3, wherein the material of the protective layer is silicon nitride, the material of the first passivation layer is resin, and the material of the second passivation layer is low temperature silicon nitride.

5. The method for producing an array substrate as claimed in claim 1, wherein the material of the protective layer is silicon nitride, the material of the first passivation layer is resin, and the material of the second passivation layer is low temperature silicon nitride.

6. The method for producing an array substrate as claimed in claim 2, wherein the material of the protective layer is silicon nitride, the material of the first passivation layer is resin, and the material of the second passivation layer is low temperature silicon nitride.

7. The method for producing an array substrate as claimed in claim 5, wherein the step of employing a first etching process to partially etch the second passivation layer in an area that needs to form a via above the drain comprises:

employing an etching condition of a mixed gas of $SF_6$, $O_2$ and He and a plasma acceleration power of 2500 W to 3500 W to perform a partial dry etching for the second passivation layer in an area that needs to form a via above the drain.

8. The method for producing an array substrate as claimed in claim 7, wherein the method comprises the step of employing a second etching process for which the ratio of the vertical etching rate to the lateral etching rate is no less than 3 to etch the remaining part in the area that needs to form a via, until the drain is exposed, and this step comprises:

employing an etching condition of a mixed gas of $SF_6$ and He and a plasma acceleration power of 6000 W to 7500 W to perform a dry etching for the remaining part in the area that needs to form a via, until the drain is exposed.

9. The method for producing an array substrate as claimed in 1, wherein the vertical etching amount achieved by employing the first etching process is 70% of the thickness of the second passivation layer.

10. The method for producing an array substrate as claimed in 1, wherein the step of employing a second etching process for which the vertical etching rate is larger than the lateral etching rate to etch the remaining part in the area that needs to form a via, until the electrode is exposed, comprises:

employing a second etching process for which the ratio of the vertical etching rate to the lateral etching rate is no less than 3 to etch the remaining part in the area that needs to form a via, until the electrode is exposed.

11. An array substrate obtained by employing the following production method:

forming in sequence from bottom to top a metal layer comprising a pattern of a gate line and a gate, a gate insulating layer and an active layer on a substrate base;

forming a metal layer comprising a pattern of a source and a drain;

forming a protective layer covering the substrate and a first passivation layer comprising a first via located above the drain and exposing the protective layer;

forming a first metal layer comprising a pattern of a first electrode;

forming a second passivation layer; wherein the method for producing the array substrate further comprises the following steps of:

producing a second via located above the drain in the second passivation layer; and forming a second metal layer comprising a pattern of a second electrode, wherein producing the second via comprises the following steps of:

employing a first etching process to partially etch the second passivation layer in an area that needs to form a via above the drain, wherein the vertical etching amount achieved by employing the first etching process is less than the thickness of the second passivation layer; and employing a second etching process for which the vertical etching rate is larger than the lateral etching rate to etch the remaining part in the area that needs to form a via, until the drain is exposed, wherein a material of the second passivation layer is silicon nitride, and wherein each of the first etching process and the second etching process is a fluorine based etching process.

* * * * *